United States Patent

Kaltner

(10) Patent No.: US 9,954,524 B2
(45) Date of Patent: Apr. 24, 2018

(54) CAPACITIVE SENSOR DEVICE AND METHOD FOR OPERATING A CAPACITIVE SENSOR DEVICE

(75) Inventor: Claus Kaltner, Bergkirchen (DE)

(73) Assignee: MICROCHIP TECHNOLOGY GERMANY GMBH, Gilching (DE)

( * ) Notice: Subject to any disclaimer, the term of this patent is extended or adjusted under 35 U.S.C. 154(b) by 754 days.

(21) Appl. No.: 13/979,204

(22) PCT Filed: Jan. 12, 2012

(86) PCT No.: PCT/EP2012/050453
§ 371 (c)(1),
(2), (4) Date: May 19, 2014

(87) PCT Pub. No.: WO2012/095497
PCT Pub. Date: Jul. 19, 2012

(65) Prior Publication Data
US 2015/0288361 A1 Oct. 8, 2015

(30) Foreign Application Priority Data
Jan. 12, 2011 (DE) .................. 10 2011 002 603

(51) Int. Cl.
H03K 17/955 (2006.01)
H03K 17/96 (2006.01)
G01D 5/24 (2006.01)

(52) U.S. Cl.
CPC .............. *H03K 17/955* (2013.01); *G01D 5/24* (2013.01); *H03K 17/962* (2013.01);
(Continued)

(58) Field of Classification Search
CPC ............... H03K 17/955; H03K 17/962; H03K 2217/960775; H03K 2017/9615; H03K 2217/960705; G01D 5/24
(Continued)

(56) References Cited

U.S. PATENT DOCUMENTS 5,506,454 A * 4/1996 Hanzawa ................ B60R 21/01
180/272
5,844,415 A * 12/1998 Gershenfeld .......... B60N 2/002
324/663
(Continued)

FOREIGN PATENT DOCUMENTS

CN 101849217 A 9/2010 ............. G06F 3/033
DE 4316263 A1 11/1993 ............. B60R 21/01
(Continued)

OTHER PUBLICATIONS

International Search Report and Written Opinion, Application No. PCT/EP2012/050453, 10 pages, dated Apr. 18, 2012.
(Continued)

*Primary Examiner* — Melissa Koval
*Assistant Examiner* — Nasima Monsur
(74) *Attorney, Agent, or Firm* — Slayden Grubert Beard PLLC

(57) ABSTRACT

A capacitive sensor device for approach and/or contact detection can be coupled with an electric circuit (10) and has a sensor electronics (20) and a device for potential separation (30), which with the sensor electronics (20) is coupled and by which the capacitive sensor device can be coupled with the electric circuit (10). In a method for operating a capacitive sensor device which has a sensor electronics, the sensor electronics can be coupled with an electric circuit and the sensor electronics is coupled with the electric circuit in a separable way with respect to the potential.

28 Claims, 1 Drawing Sheet

(52) U.S. Cl.
CPC ............... *H03K 2017/9615* (2013.01); *H03K 2217/960705* (2013.01); *H03K 2217/960775* (2013.01)

(58) Field of Classification Search
USPC ....... 324/671, 662, 686, 629, 658, 660, 679, 324/690, 600, 548, 672, 71.1; 345/174, 345/173, 156, 55; 178/18.06, 19.03; 340/870.37, 562; 361/679.01, 679.3, 361/679.56; 327/517
See application file for complete search history.

(56) References Cited

U.S. PATENT DOCUMENTS

| | | | |
|---|---|---|---|
| 6,257,061 B1 * | 7/2001 | Nonoyama | G01P 15/125 324/661 |
| 6,664,661 B1 * | 12/2003 | Palata | H03K 17/955 307/112 |
| 8,493,074 B2 | 7/2013 | Unterreitmayer et al. | 324/600 |
| 2008/0231292 A1 * | 9/2008 | Ossart | G01B 7/08 324/688 |
| 2009/0303176 A1 * | 12/2009 | Chen | G06F 3/017 345/156 |
| 2011/0189952 A1 | 8/2011 | Barrenscheen et al. | 455/41.1 |

FOREIGN PATENT DOCUMENTS

| | | | |
|---|---|---|---|
| FR | 2756048 A1 | 5/1998 | ............... G01B 7/02 |
| WO | 2009/130165 A2 | 10/2009 | ............. G06F 3/033 |
| WO | WO 2009130165 A2 * | 10/2009 | ........... G06F 1/3203 |
| WO | 2012/095497 A1 | 7/2012 | ........... H03K 17/955 |

OTHER PUBLICATIONS

European Office Action, Application No. 12701324.1, 7 pages, dated Jul. 30, 2015.
Chinese Office Action, Application No. 201280005091.7, 13 pages, dated Aug. 19, 2015.
Chinese Office Action, Application No. 201280005091.7, 23 pages, May 16, 2016.
Chinese Office Action, Application No. 201280005091.7, 26 pages, dated Feb. 24, 2017.
Chinese Office Action, Application No. 201280005091.7, 10 pages, Oct. 14, 2016.
European Office Action, Application No. 12701324.1, 9 pages, dated Nov. 10, 2016.
Korean Office Action, Application No. 20137021129, 16 pages, dated Jul. 27, 2017.
Korean Final Office Action, Application No. 20137021129, 5 pages, dated Nov. 28, 2017.

* cited by examiner

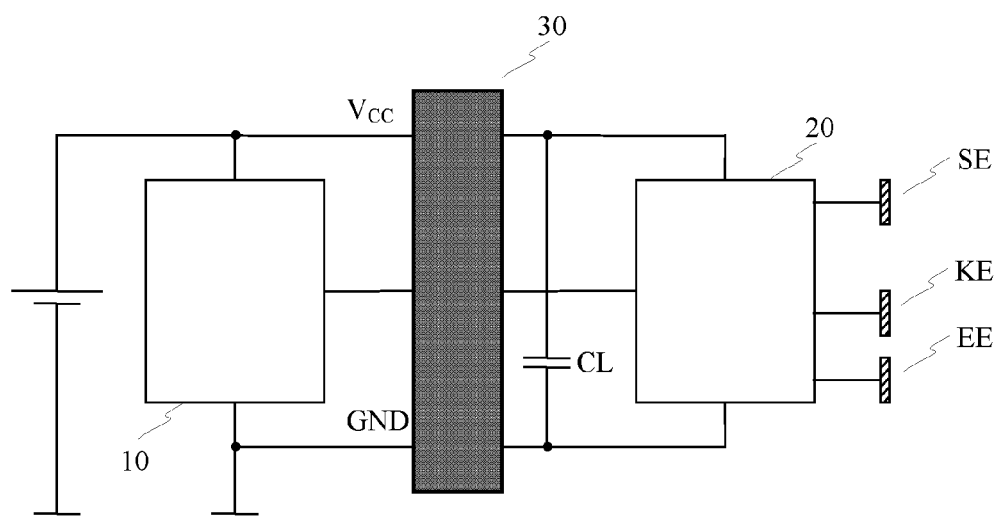

CAPACITIVE SENSOR DEVICE AND METHOD FOR OPERATING A CAPACITIVE SENSOR DEVICE

CROSS-REFERENCE TO RELATED APPLICATIONS

This application is a U.S. National Stage Application of International Application No. PCT/EP2012/050453 filed Jan. 12, 2012, which designates the United States of America, and claims priority to DE Patent Application No. 10 2011 002 603.7 filed Jan. 12, 2011. The contents of which are hereby incorporated by reference in their entirety.

TECHNICAL FIELD

The invention relates to a capacitive sensor device for approach and/or contact detection, which can be coupled with an electric circuit, for example a microprocessor of an electric hand-held device. Moreover the invention concerns a method for operating a capacitive sensor device for approach and/or contact detection.

BACKGROUND

Capacitive approach and/or contact sensors measure, by generating and measuring electric alternating fields, the approach of an object to the sensor electrodes or the touch of the sensor electrodes by an object. Capacitive sensor devices known from prior art, especially when they are employed in mobile electric devices, have the disadvantage that the quality and the stability of the detection of an approach or a contact depends much on the ground reference of the mobile device or on the connection between the ground of the device and an operator of the mobile device.

For example a connection of peripherals at a mobile device may entail that the device obtains a ground reference, which can negatively affect the measurement or detection of an approach and/or contact. A connection between the ground of the devices and an operator of the device can take place for example by a ground coupling, for instance by an accumulator, of the electric device onto the human body.

In this respect it is particularly disadvantageous that the ground reference of the mobile device or the ground coupling on the human body can vary during the operation of the electric device, for example if during the operation a peripheral having a ground reference is connected to the electric device. This may entail that a detection of an approach or a contact which at first is correct leads to a wrong detection. For example the formation of a ground reference of the mobile device during the operation may entail that for instance a grasp of the mobile device by a hand is not recognized as such by mistake.

In capacitive sensor devices known from prior art one tries with two electrodes (transmitting electrode and reception electrode) to solve this problem by the fact that the sensor device substantially can be operated in two different modes. If it is known that the device is grounded, the capacitive sensor device can be operated in a so-called absorption mode, in which a signal reduction of an electric signal at the reception electrodes is evaluated. The signal reduction substantially arises by the deduction of the alternating electric field between the transmitting electrode and the reception electrode by means of a body approaching the electrodes, which presents a ground reference. On the other hand if it is known that the device is not grounded, the capacitive sensor device can be operated in a so-called transmission mode. In the transmission mode an approach of an electrically conductive object, which may be grounded, entails a rise of an electric signal tapped at the reception electrodes.

This method has however the disadvantage that mostly it is not known if the electric device has a ground reference or how strong a ground coupling of the electric device is. In order to operate a capacitive sensor device in the correct operating mode, in the methods known from prior art it is determined at first if a ground reference of the electric device is present or not. In order to detect the ground reference or the strength of the ground coupling, however additional measures must be taken, which entail a considerable rise of the cost of the capacitive sensor device.

SUMMARY

According to various embodiments, a capacitive sensor device as well as a method for the capacitive approach and/or contact detection can be provided which at least partially avoid the disadvantages known from prior art and which guarantee a reliable and robust detection of an approach or a contact, especially independently of the ground reference of an electric device in which the capacitive sensor device is used and independently of a changing ground coupling.

According to an embodiment, a capacitive sensor device for approach and/or contact detection which can be coupled with an electric circuit, wherein the capacitive sensor device comprises:
   an electrode configuration, having at least one transmission electrode, at least one compensation electrode and at least one reception electrode, in which at the transmission electrode and at the compensation electrode each time an alternating electrical field can be emitted, which can be coupled into the reception electrode,
   a sensor electronics which can be coupled with the electrode configuration and which at least during a measuring interval, supplies the transmission electrode and the compensation electrode each with an electric alternating signal and taps an electrical value at the reception electrode, and
   a device for potential separation, which with the sensor electronics is coupled and by means of which the capacitive sensor device can be coupled with the electric circuit.

The potential separation ensures that the ground of the electric circuit is independent of the ground of the sensor electronics. It is advantageous that it need not be detected whether or not a device in which the sensor device according to various embodiments is arranged, or the electric circuit, is grounded or with which coupling the device or the electric circuit has a ground reference. Also the reference between human being and ground of the device or the electric circuit is irrelevant. The sensor device always works with equal sensitivity.

The device for potential separation can be arranged to galvanically separate, at least during the measuring interval, the capacitive sensor device from the electric circuit.

It is advantageous if the device for potential separation is arranged to galvanically separate the capacitive sensor device from the electric circuit in a time-division multiplex method.

It has shown that the device for potential separation can include a filter for frequency selective separation of the capacitive sensor device from the electric circuit, preferably during the measuring interval.

The device for potential separation can include at least one from the following: optical coupling device, capacitive coupling device, and inductive coupling device, in order to couple the capacitive sensor device with the electric circuit.

In one embodiment the device for potential separation can have at least one electric switch, by which the sensor electronics can be coupled with the electric circuit.

The sensor electronics can be further arranged to supply the transmission electrode with an electric alternating signal, which is phase-shifted with respect to the electric alternating signal fed at the compensation electrodes.

The electric circuit can be part of an electric hand-held device, especially of a mobile phone, of a two-way radio, a computer mouse, a remote control device, a digital camera, a game controller, a movable minicomputer, or a tablet PC.

According to another embodiment, in a method for operating a capacitive sensor device which comprises a sensor electronics and an electrode configuration that can be coupled with it, wherein the sensor electronics can be coupled with an electric circuit, a transmission electrode and a compensation electrode of the electrode configuration are each supplied with an electric alternating signal in order to emit an alternating electrical field at each of them, which can be coupled into a reception electrode of the electrode configuration, wherein at the reception electrode an electrical value can be tapped, and the sensor electronics is coupled with the electric circuit in a potentially separable way.

In one embodiment at least during the measuring interval the capacitive sensor device can be galvanically isolated from the electric circuit.

The capacitive sensor device can be galvanically isolated from the electric circuit in a time-division multiplex method.

The potential separation can be done with a device which comprises at least one of the following: optical coupling device, capacitive coupling device, inductive coupling device, and electric switch.

Moreover an electric hand-held device can be provided which presents at least one electric circuit and a capacitive sensor device coupled with it, wherein the electric circuit is potentially separable from the capacitive sensor device.

The potential separation can take place with a device for potential separation which is preferably arranged, at least during a measuring cycle, in which the approach or contact is detected or is to be detected, to potentially separate the electric circuit from the capacitive sensor device.

The electric hand-held device can be a smart phone, a two-way radio, a computer mouse, a remote control device, a digital camera, a game controller, a PDA, a tablet PC, a dictating machine or similar.

BRIEF DESCRIPTION OF THE DRAWING

Further details and characteristics as well as concrete embodiments result from the following description in connection with the drawing, wherein the only FIGURE schematically shows a block scheme of a capacitive sensor device according to various embodiments which can be coupled with an electric circuit, for example a two-way radio.

DETAILED DESCRIPTION

FIG. 1 shows a block scheme of a capacitive sensor device according to various embodiments for approach and/or contact detection, which can be coupled with an electric circuit 10. The electric circuit 10 can be for example the device electronics of a mobile phone or another device, especially a mobile device.

The capacitive sensor device shows a sensor electronics 20 and an electrode configuration coupled with the sensor electronics 20. The electrode configuration comprises a transmitting electrode SE, a compensation electrode KE and a reception electrode EE. For detecting an approach or a contact the sensor electrodes of the electrode configuration are arranged for example on a housing of an electric hand-held device.

The sensor electrode SE and the compensation electrode KE are each supplied with an electric alternating signal, in which the electric alternating signal supplied to the compensation electrode KE can be preferably phase-shifted with respect to the electric alternating signal supplied to the transmitting electrode. The electric alternating signals supplied to the transmitting electrode and to the reception electrode can also have each a different amplitude.

At the transmitting electrode SE and at the compensation electrodes KE is each emitted an alternating electrical field, which couple into the reception electrode EE. The compensation electrode K is preferably arranged in such a way with respect to the transmitting electrode SE and the reception electrode EE that in case of an approach or a contact of an object to be detected or by an object to be detected, a part of the alternating electric field emitted at the transmitting electrode SE couples in by means of the object into the reception electrode EE. This means that by an approach or a contact the capacitive coupling between the transmitting electrode and the reception electrode is enlarged, which entails a significant increase of an electric signal tapped at the reception electrodes.

The sensor electronics 20 is coupled, by means of a device for potential separation 30, with the electric circuit 10. The device for potential separation 30 is provided to separate the sensor electronics 20 as for the potential from the electric circuit 10. According to various embodiments the device for the potential separation guarantees that the sensor electronics 20 at least during a measuring cycle is galvanically isolated from the electric circuit 10 or that the connection between the electric circuit 10 and the sensor electronics 20 has a high resistance at least during a measuring cycle.

The sensor electronics 20 can provide a electrical charge storage, by which the sensor electronics 20 is supplied with energy when the sensor electronics 20 is separated galvanically from the electric circuit 10. The electrical charge storage can include a capacitor CL. The capacitor is dimensioned in such a way that at least during the measurement the sensor electronics 20 is supplied with energy sufficiently and the measured values remain stored in a storage device of the sensor electronics 20 at least for such a long time until they can be transmitted to the electric circuit 10.

Alternatively the energy for the sensor electronics 20 can also be provided by a battery, an accumulator or a solar cell.

In one embodiment the device for potential separation 30 is arranged in such a way that at least during one measuring cycle, in which an approach or a contact is measured or detected, the sensor electronics 20 can be separated as for the potential from the electric circuit 10. This can be done for example by means of electric switches, which are opened at the beginning of the measuring cycle and are closed again after the end of the measuring cycle, for example for a data or signal transmission to the electric circuit 10. During the measuring cycle thus the sensor electronics 20 is separated galvanically from the electric circuit 10.

The electric circuit 10 can however also be permanently galvanically isolated from the sensor electronics 20 by the device for potential separation 30. For this purpose the device for potential separation 30 can for example be formed in such a way that the electric circuit 10 is coupled for example capacitively, inductively or optically with the sensor electronics 20. In this way on the one hand the sensor electronics 20 can be supplied with energy by the electric circuit 10. On the other hand a potential-related separation of the sensor electronics 20 from the electric circuit 10 is guaranteed also during a measuring cycle.

The potential-related separation of the sensor electronics 20 from the electric circuit 10 can however also be done by means of a frequency selective separation, for example by means of a filter. The connection between the electric circuit 10 and the sensor electronics 20 has a high resistance only for the frequency range of the sensor signal, for the remaining frequency range it has a low resistance. In this way the power supply of the sensor electronics 20 by the electric circuit 10 and the communication between the sensor electronics 20 and the electric circuit 10 are possible also during the measuring cycle.

By the potential-related separation of the electric circuit 10 from the sensor electronics 20 the ground of the sensor electronics 20 is independent of the ground of the electric circuit 10 or the ground of the devices, for example an electric hand-held device, in which the capacitive sensor device is used. Therefore even in case of an approach of a grounded body no absorption effect of the alternating electric field formed between the sensor electrodes occurs. This means that in case of an approach of an object to the sensor electrodes the coupling between the electrodes SE and KE formed as transmission electrodes and the reception electrode EE becomes greater and thus the level of the electric signal tapped at the reception electrode EE rises.

The capacitive sensor device therefore can be operated, compared to the measurement method known from prior art, always in the so-called transmission mode.

A change between the so-called absorption mode and the transmission mode depending on the ground coupling of the electric device is no more necessary. Moreover there is no need to detect if the device is grounded or with which coupling the system has a ground reference. Also the reference between a person who approaches the capacitive sensor device or the sensor electrodes is negligible. Altogether the capacitive sensor device according to various embodiments guarantees that it always operates with the same sensitivity, and different grounding conditions or changing grounding conditions have no influence on the detection or on a detection result.

The capacitive sensor device according to various embodiments can be used in an electric hand-held device, for example a smart phone, a two-way radio, a computer mouse, a remote control device, a digital camera, a game controller, a PDA, a tablet PC, a dictating machine, or similar, in order to detect an approach to an electric hand-held device or a contact of an electric hand-held device, independently of the ground reference of the electric band-held device.

What is claimed is:

1. A capacitive sensor device for approach and/or contact detection, configured to be coupled with an electric circuit, wherein the electric circuit is coupled with a power supply, comprising
    an electrode configuration, having at least one transmission electrode, at least one compensation electrode and at least one receiving electrode, in which the transmission electrode and the compensation electrode are configured to each emit an alternating electrical field which is coupled into the receiving electrode,
    a sensor-electronics configured to be coupled with the electrode configuration and which, at least during a measuring interval, supplies the transmission electrode and the compensation electrode each with an electric alternating signal and taps an electrical value at the receiving electrode, and
    a device for potential separation having a primary side and a secondary side, wherein the secondary side is directly coupled with the sensor electronics and the primary side is coupled with the electric circuit and said power supply.

2. The sensor device according to claim 1, wherein the device for potential separation, at least during the measuring interval, galvanically separates the capacitive sensor device from the electric circuit.

3. The sensor device according to claim 1, wherein the device for potential separation galvanically separates the capacitive sensor device from the electric circuit in a time-division multiplex method.

4. The sensor device according to claim 1, wherein the device for potential separation comprises a filter for the frequency-selective separation of the capacitive sensor device from the electric circuit, preferably during the measuring interval.

5. The sensor device according to claim 1, wherein the device for potential separation comprises at least one of optical coupling device, capacitive coupling device, and inductive coupling device, in order to couple the capacitive sensor device with the electric circuit.

6. The sensor device according to claim 1, wherein the device for potential separation presents at least one electric switch, by which the sensor-electronics is configured to be coupled with the electric circuit.

7. The sensor device according to claim 1, wherein the sensor-electronics further supplies the transmission electrode with an electric alternating signal, which is phase-shifted with respect to the electric alternating signal supplied at the compensation electrode.

8. The sensor device according to claim 1, wherein the electric circuit is part of an electric hand-held device, especially of a mobile phone, a two-way radio, a computer mouse, a remote control device, a digital camera, a game controller, a movable minicomputer, or a tablet PC.

9. The sensor device according to claim 1, wherein the device for potential separation is configured to decouple the electric circuit and the sensor electronics during the measuring interval and to couple the electric circuit and the sensor electronics after the measuring interval.

10. The sensor device according to claim 1, wherein during the measuring interval the electric circuit and the sensor electronics are independently grounded.

11. The capacitive sensor device according to claim 1, wherein the sensor-electronics comprise an electrical charge storage which is charged by the power supply when a measurement cycle is not performed.

12. The capacitive sensor device according to claim 11, wherein the sensor-electronics store the measured electrical value for a time until they can be transmitted to the electric circuit.

13. A method for operating a capacitive sensor device, which comprises a sensor-electronics coupled with an electrode configuration, wherein the sensor-electronics is configured to be directly coupled with an electric circuit and a power supply, the method comprising:

providing at least during a measurement cycle a potential separation between the electric circuit coupled with the power supply and the sensor-electronics by a device for potential separation having a primary side and a secondary side, wherein the secondary side is directly coupled with the sensor electronics and the primary side is coupled with the electric circuit and said power supply;

supplying at least during each measurement cycle a first and second electric alternating signal by the sensor electronics to a transmission electrode and a compensation electrode of the electrode configuration, respectively to emit at them an alternating electrical field, which is coupled into a receiving electrode of the electrode configuration, wherein the receiving electrode provides for an electrical value to be measured.

14. The method according to claim 13, in which at least during the measuring cycle the capacitive sensor device is galvanically isolated from the electric circuit.

15. The method according to claim 13, wherein the capacitive sensor device is galvanically isolated from the electric circuit in a time-division multiplex method.

16. The method according to claim 13, wherein the potential separation is done with a device, which comprises at least one of optical coupling device, capacitive coupling device, inductive coupling device, and electric switch.

17. The method according to claim 13, wherein the sensor-electronics comprise an electrical charge storage which is charged by the power supply when a measurement cycle is not performed.

18. The method according to claim 17, wherein the sensor-electronics store the measured electrical value for a time until they can be transmitted to the electric circuit.

19. A mobile device comprising:
a capacitive sensor device for approach and/or contact detection, which is configured to be coupled with an electric circuit and a power supply of the mobile device, wherein the electric circuit comprises a microprocessor, wherein the capacitive sensor device comprises:
an electrode configuration, having at least one transmission electrode, at least one compensation electrode and at least one receiving electrode, and
a sensor-electronics coupled with the electrode configuration and which, at least during a measuring interval, supplies the transmission electrode and the compensation electrode each with an electric alternating signal, respectively and receives an electrical value from the receiving electrode, and
a device for potential separation comprising a primary side coupled with the electric circuit and the power supply and a secondary side directly coupled with the sensor-electronics wherein the device for potential separation is configured to provide at least during each measurement cycle a potential separation between the primary and secondary side.

20. The mobile device according to claim 19, wherein the device for potential separation, at least during the measuring interval, galvanically separates the capacitive sensor device from the electric circuit.

21. The mobile device according to claim 19, wherein the device for potential separation galvanically separates the capacitive sensor device from the electric circuit in a time-division multiplex method.

22. The mobile device according to claim 19, wherein the device for potential separation comprises a filter for the frequency-selective separation of the capacitive sensor device from the electric circuit, preferably during the measuring interval.

23. The mobile device according to claim 19, wherein the device for potential separation comprises at least one of optical coupling device, capacitive coupling device, and inductive coupling device, in order to couple the capacitive sensor device with the electric circuit.

24. The mobile device according to claim 19, wherein the device for potential separation presents at least one electric switch, by which the sensor-electronics is configured to be coupled with the electric circuit.

25. The mobile device according to claim 19, wherein the sensor-electronics further supplies the transmission electrode with an electric alternating signal, which is phase-shifted with respect to the electric alternating signal supplied at the compensation electrode.

26. The mobile device according to claim 19, wherein the mobile device is a mobile phone, a two-way radio, a computer mouse, a remote control device, a digital camera, a game controller, a laptop computer, or a tablet PC.

27. The mobile device according to claim 19, wherein the sensor-electronics comprise an electrical charge storage which is charged by the power supply when a measurement cycle is not performed.

28. The sensor device according to claim 27, wherein the sensor-electronics store the measured electrical value for a time until they can be transmitted to the electric circuit.

* * * * *